United States Patent [19]
Nishimoto

[11] Patent Number: 5,307,324
[45] Date of Patent: Apr. 26, 1994

[54] SEMICONDUCTOR MEMORY DEVICE INCLUDING ADDRESS TRANSITION DETECTING CIRCUIT

[75] Inventor: Masaki Nishimoto, Hyogo, Japan

[73] Assignee: Mitsubishi Denki Kabushiki Kaisha, Tokyo, Japan

[21] Appl. No.: 963,211

[22] Filed: Oct. 19, 1992

[30] Foreign Application Priority Data

Feb. 3, 1992 [JP] Japan .................................. 4-17662

[51] Int. Cl.⁵ .................................................. G11C 7/00
[52] U.S. Cl. ............................ 365/233.5; 365/189.04; 365/189.05; 365/230.08
[58] Field of Search .......... 365/233.5, 189.05, 230.08, 365/189.04

[56] References Cited

U.S. PATENT DOCUMENTS

| | | | |
|---|---|---|---|
| 4,581,718 | 4/1986 | Oishi | 365/230.08 X |
| 4,722,074 | 1/1988 | Fujishima et al. | 365/230.08 X |
| 4,899,313 | 2/1990 | Kumanoya et al. | 365/189.04 X |
| 5,065,365 | 11/1991 | Hirayama | 365/189.05 |
| 5,068,831 | 11/1991 | Hoshi et al. | 365/233.5 X |

FOREIGN PATENT DOCUMENTS 1-105387 4/1989 Japan .

Primary Examiner—Eugene R. LaRoche
Assistant Examiner—Do Hyun Yoo
Attorney, Agent, or Firm—Lowe, Price, LeBlanc & Becker

[57] ABSTRACT

A transistor is provided for taking written data between a data bus line and a latch circuit in a main amplifier circuit. The gate of the transistor is supplied with a write control signal generated by a write control circuit in writing operation.

11 Claims, 15 Drawing Sheets

FIG. 13                                         PRIOR ART
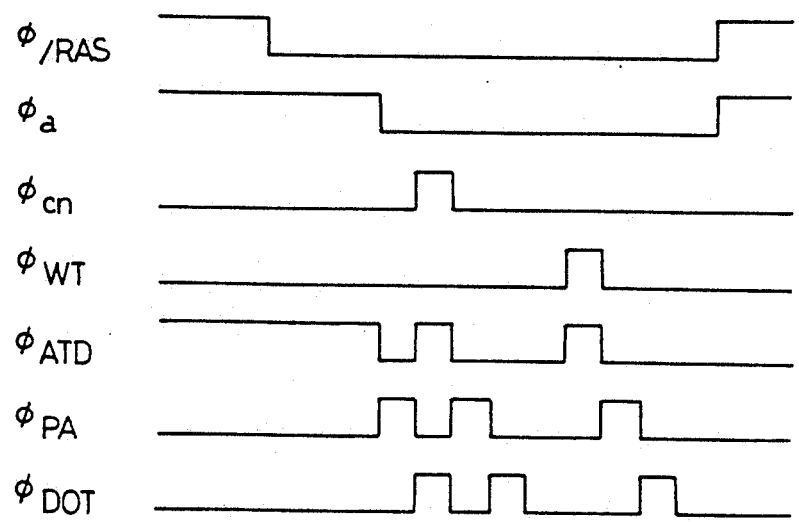
FIG. 14                                         PRIOR ART
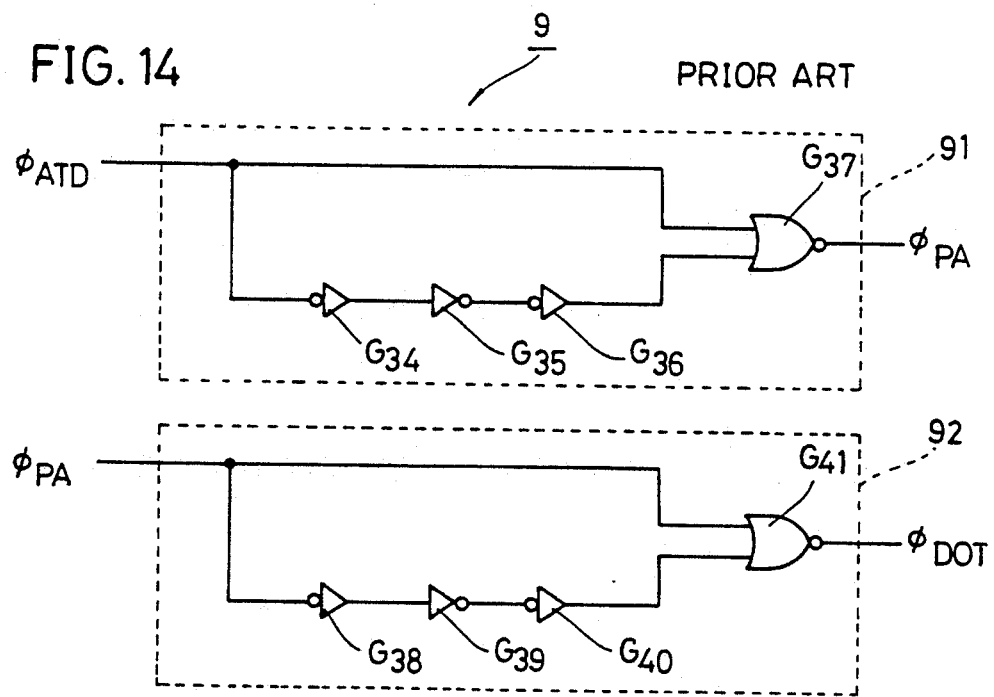

SEMICONDUCTOR MEMORY DEVICE INCLUDING ADDRESS TRANSITION DETECTING CIRCUIT

BACKGROUND OF THE INVENTION

1. Field of the Invention

The present invention relates to semiconductor memory devices, and particularly to semiconductor memory devices including address transition detecting circuits, and an operating method thereof.

2. Description of the Background Art

FIG. 7 is a block diagram showing one example of a conventional dynamic random access memory (hereinafter referred to as DRAM). In FIG. 7, a memory array 1 includes a plurality of dynamic type memory cells arranged in a matrix, and a decoder selecting any one of the plurality of dynamic type memory cells. An address buffer 2 receives externally applied address signals A0-An to generate internal address signals a0-an. The decoder in the memory array 1 decodes the internal address signals a0-an to select a memory cell of an address designated by the internal address signals a0-an.

A RAS buffer 3 receives an external row address strobe signal /RAS to generate an internal row address strobe signal $\phi_{/RAS}$. A CAS buffer 4 receives an external column address strobe signal /CAS to generate an internal column address strobe signal $\phi_{/CAS}$.

The internal row address strobe signal $\phi_{/RAS}$ is an internal signal for activating the entire system, and changes in synchronization with the external row address strobe signal /RAS. The internal column address strobe signal $\phi_{/CAS}$ is an internal signal for activating a column system, and changes in synchronization with the external column address strobe signal /CAS.

A write control circuit 5 generates write control signals $\phi_{WR}$, $\phi_{WDE}$, and $\phi_{WT}$ in response to an external write enable signal /WE, the internal row address strobe signal $\phi_{/RAS}$ and the internal column address strobe signal $\phi_{/CAS}$. An input buffer circuit 6 provides data D applied to an input/output terminal IOT to a data bus line DB in response to the write control signal $\phi_{WR}$. A write buffer circuit 7 provides the data on the data bus line DB to an input/output bus line IOB in response to the write control signal $\phi_{WDE}$.

An ATD generating circuit 8 responds to the internal row address strobe signal $\phi_{/RAS}$, the write control signal $\phi_{WT}$ and a control signal $\phi_a$ to detect transitions of the internal address signals a0-an to generate an ATD (address transition detection) signal $\phi_{ATD}$. An output control circuit 9 generates output control signals $\phi_{PA}$, and $\phi_{DOT}$ in response to the ATD signal $\phi_{ATD}$.

A preamplifier circuit 10 responds to the output control signal $\phi_{PA}$ to amplify the data on the input/output bus line IOB and provides the amplified data to the data bus line DB. A main amplifier circuit 11 responds to the output control signal $\phi_{DOT}$ to amplify and hold the data on the data bus line DB, and applies the held data to the input/output terminal IOT in response to an external output enable signal OE.

Reading and writing operations of the DRAM will now be described.

In a reading cycle, when the internal address signals a0-an change, the ATD generating circuit 8 generates the ATD signal $\phi_{ATD}$, while in the memory array 1, the data is read from an address designated by the internal address signals a0-an to the input/output bus line IOB. The output control circuit 9 first generates the output control signal $\phi_{PA}$ in response to the ATD signal $\phi_{ATD}$. The preamplifier circuit 10 responds to the output control signal $\phi_{PA}$ to amplify the data read to the input/output bus line IOB, and applies the amplified data to the data bus line DB.

The output control circuit 9 then generates the output control signal $\phi_{DOT}$. The main amplifier circuit 11 responds to the output control signal $\phi_{DOT}$ to amplify and hold the data on the data bus line DB. In addition, the main amplifier circuit 11 responds to the external output enable signal OE to output the held data to the input/output terminal IOT.

In a writing cycle, the write control circuit 5 first generates the write control signal $\phi_{WR}$. The input buffer circuit 6 responds to the write control signal $\phi_{WR}$ to input and amplify the data D externally applied to the input/output terminal IOT, and applies the amplified data to the data bus line DB.

The write control circuit 5 then generates the write control signal $\phi_{WDE}$. The write buffer circuit 7 responds to the write control signal $\phi_{WDE}$ to input and amplify the data on the data bus line DB, and applies the amplified data to the input/output bus line IOB. The data on the input/output bus line IOB is written in an address in the memory array 1 designated by the internal address signals a0-an.

At the end of the writing operation, the write control circuit 5 generates the write control signal $\phi_{WT}$. The ATD generating circuit 8 is activated in response to the write control signal $\phi_{WT}$, to generate the ATD signal $\phi_{ATD}$, so that in the same manner as that of the reading cycle, the data written in the memory array 1 is provided to the data bus line DB through the input/output bus line IOB and the preamplifier circuit 10, and further amplified and held by the main amplifier circuit 11.

FIG. 8 shows a signal waveform diagram of a writing cycle. As can be seen from FIG. 8, the write control signal $\phi_{WR}$ first rises, and thereafter the write control signal $\phi_{WDE}$ rises. Consequently, the data externally applied to the input/output terminal IOT is written in the memory array 1 through the input buffer 6 and the write buffer 7.

At the end of the writing operation, the write control signal $\phi_{WT}$ rises. In response to the rise of the write control signal $\phi_{WT}$, the ATD signal $\phi_{ATD}$ rises. The output control signal $\phi_{PA}$ and the output control signal $\phi_{DOT}$ then rise sequentially. Consequently, the data written in the memory array 1 is provided through the preamplifier circuit 10 to the main amplifier circuit 11 and held therein.

The reason for reading the data written in the memory array 1 to the main amplifier circuit 11 at the end of the writing operation will be described in the following.

As described above, reading operation is carried out in response to the ATD signal $\phi_{ATD}$. However, in the case of writing data to a certain address in the memory cell array 1 and reading the data from the same address thereafter, the ATD signal $\phi_{ATD}$ is not generated since the internal address signals a0-an do not change. Therefore, the preamplifier circuit 10 and the main amplifier circuit 11 do not operate, and the data read from the memory array 1 can not be output.

In order to avoid this, the ATD generating circuit 8 is activated by the write control signal $\phi_{WT}$ at the end of the writing operation, so that the data written in the memory array 1 can be held in the main amplifier circuit 11.

FIG. 9 is a schematic diagram showing a detailed structure of the write control circuit 5. The write control circuit 5 includes signal generating circuits 51, 52, 53, and 54. The signal generating circuit 51 includes a NOR gate G1, inverters G2, G3, and G4 and NAND gates G5, G6, and G7. The signal generating circuit 52 includes inverters G8, G9, G10, and G12 and a NAND gate G11. The signal generating circuit 53 includes inverters G13, G14, and G15 and a NOR gate G16. The signal generating circuit 54 includes inverters G17, G18, and G19 and a NOR gate G20.

The signal generating circuit 51 generates a control signal $\phi_W$ in response to the external write enable signal /WE, the internal row address strobe signal $\phi_{/RAS}$ and the internal column address strobe signal $\phi_{/CAS}$. The signal generating circuit 52 generates the write control signal $\phi_{WR}$ in response to the control signal $\phi_W$. The signal generating circuit 53 generates the write control signal $\phi_{WDE}$ in response to the write control signal $\phi_{WR}$. The signal generating circuit 54 generates the write control signal $\phi_{WT}$ in response to the control signal $\phi_W$.

As can be seen in FIG. 8, when the internal column address strobe signal $\phi_{/CAS}$ falls to "L", with the external write enable signal /WE and the internal row address strobe signal $\phi_{/RAS}$ being both in an "L" state, the control signal $\phi_W$ attains "H" (writing state). When the internal column address strobe signal $\phi_{/CAS}$ rises to "H" thereafter, the control signal $\phi_W$ falls to "L".

In response to the rise of the control signal $\phi_W$, the write control signal $\phi_{WR}$ rises to "H", and falls to "L" after a prescribed time. In response to the fall of the write control signal $\phi_{WR}$, the write control signal $\phi_{WDE}$ rises to "H", and falls to "L" after a prescribed time. In response to the fall of the control signal $\phi_W$, the write control signal $\phi_{WT}$ rises to "H", and falls to "L" after a prescribed time.

FIG. 10 is a schematic diagram showing a detailed structure of the input buffer circuit 6. The input buffer circuit 6 includes a NOR gate G21, inverters G22, G23, G24, G25, G26, and G27, P channel MOS transistors P1, P2, P3, and P4 and N channel MOS transistors N1, N2, N3, and N4. The transistors P1, P2, N1, and N2 constitute an inverter 61, and the transistors P3, P4, N3, and N4 constitute an inverter 62. The inverters G24 and G25 constitute a latch circuit L1.

When the internal row address strobe signal $\phi_{/RAS}$ is "L", the data D externally applied to the input/output terminal IOT is applied through the NOR gate G21 and the inverter G22 to the inverter 61.

When the write control signal $\phi_{WR}$ becomes "H", the inverter 61 is activated, whereby the data is input and latched in the latch circuit L1. When the control signal $\phi_W$ is "H", the inverter 62 is in an activated state, whereby the data latched in the latch circuit L1 is applied through the inverters G26, 62 to the data bus line DB.

FIG. 11 is a schematic diagram showing a detailed structure of the write buffer circuit 7. The write buffer circuit 7 includes N channel MOS transistors N5, N6, N7, and N8, NOR gates G30 and G31, and inverters G28 and G29. The input/output bus line IOB includes a pair of input/output lines IO1 and IO2.

When the write control signal $\phi_{WDE}$ attains "H", the data on the data bus line DB is applied through the inverter G28 and the NOR gate G30 to the gates of the transistors N5 and N8, and through the NOR gate G31 to the gates of the transistors N6 and N7, so that the data on the data bus line DB is applied to the input/output line IO1, and the inverted data of the data on the data bus DB is applied to the input/output line IO2. That is, the input/output lines IO1, and IO2 are supplied with complementary data.

FIG. 12 is a schematic diagram showing a detailed structure of the ATD generating circuit 8. The ATD generating circuit 8 includes a NOR gate G32, an inverter G33, N channel MOS transistors N9, N10, and N11, and detecting circuits 81-8n.

The detecting circuits 81-8n respectively detect transitions of the internal address signals a0-an to generate detection pulses $\phi_{c0}$-$\phi_{cn}$. The NOR gate G32 generates an output signal "H", when the internal row address strobe signal $\phi_{/RAS}$ and the control signal $\phi_a$ attain "L".

As is shown in FIG. 13, when any of the detecting circuits 81-8n generates the detection pulse $\phi_{ci}$(i=0-n), either of the transistors N9-N10 is turned on, whereby a pulse appears on the ATD signal $\phi_{ATD}$ provided from the inverter G33. When a pulse is generated on the write control signal $\phi_{WT}$, the transistor N11 is turned on, and a pulse appears on the ATD signal $\phi_{ATD}$. The control signal $\phi_a$ is a delay signal of the internal row address strobe signal $\phi_{/RAS}$.

FIG. 14 is a schematic diagram showing a detailed structure of the output control circuit 9. The output control circuit 9 includes signal generating circuits 91, 92. The signal generating circuit 91 includes inverters G34, G35, and G36 and a NOR gate G37. The signal generating circuit 92 includes inverters G38, G39, and G40 and a NOR gate G41.

The signal generating circuit 91 responds to the ATD signal $\phi_{ATD}$ to generate the output control signal $\phi_{PA}$. The signal generating circuit 92 responds to the output control signal $\phi_{PA}$ to generate the output control signal $\phi_{DOT}$.

As can be seen in FIG. 13, the output control signal $\phi_{PA}$ rises to "H" in response to a fall of the ATD signal $\phi_{ATD}$, and after a prescribed time period falls to "L". The output control signal $\phi_{DOT}$ rises to "H" in response to a fall of the output control signal $\phi_{PA}$, and after a prescribed time period falls to "L".

FIG. 15 is a schematic diagram showing a detailed structure of the preamplifier circuit 10. The preamplifier circuit 10 includes P channel MOS transistors P5-P9, N channel MOS transistors N12-N17, and inverters G42-G45. The transistors P5, P6, N12, N13, and N14 constitute an amplifier 101. The transistors P7 and N15 constitute a transfer gate 102. The inverters G43 and G44 constitute a latch circuit 103. The transistors P8, P9, N16, and N17 constitute an inverter 104.

When the output control signal $\phi_{PA}$ is "H", the amplifier 101 is activated, so that the data on the input/output lines IO1, and IO2 is amplified by the amplifier 101 to be applied to the transfer gate 102. When the output control signal $\phi_{PA}$ is "H", the transfer gate 102 is turned on, so that the data amplified by the amplifier 101 is applied to the latch circuit 103 and latched therein. The inverter 104 is activated when the control signal $\phi_W$ is "L", so that the data latched in the latch circuit 103 is applied to the data bus line DB.

FIG. 16 is a schematic diagram showing a detailed structure of the main section of the main amplifier circuit 11. The main amplifier circuit 11 includes a clocked inverter G46, inverters G47, G48, and G49, NAND gates G50 and G51, and N channel MOS transistors N18, and N19. The inverter G47 and G48 constitute a latch circuit 111.

When the output control signal $\phi_{DOT}$ is "H", the clocked inverter G46 is activated, whereby the data on the data bus line DB is applied to the latch circuit 111 and held therein. When the external output enable signal OE is "H", the data latched in the latch circuit 111 and the inverted data thereof are respectively applied through the NAND gate G50 and G51 to the gates of the transistors N18 and N19, and consequently the data is applied to the input/output terminal IOT.

As described above, a conventional DRAM needs to activate the ATD generating circuit 8 and the preamplifier circuit 10 at the end of the writing operation. A problem of increase of a consumed current thus arises.

SUMMARY OF THE INVENTION

One object of the present invention is to reduce a consumed current in writing operation in a semiconductor memory device including an ATD generating circuit.

Another object of the present invention is to enable a main amplifier circuit to take written data without activating an ATD generating circuit and a preamplifier circuit in writing operation in a dynamic random access memory. A semiconductor memory device according to the present invention includes a memory circuit for storing data, an address signal input circuit, a data bus, an input buffer circuit, an amplifier circuit, an address transition detecting circuit, a first control circuit and a second control circuit.

The address signal input circuit receives an externally applied address signal. The data bus transmits data to be written in the address of the memory circuit designated by the address signal, or data read from the address of the memory circuit designated by the address signal. The input buffer circuit receives externally applied data, and applies the same to the data bus. The amplifier circuit amplifies and holds the data read onto the data bus.

The address transition detecting circuit detects transition of the address signal from the address signal input circuit to generate a detection signal. The first control circuit activates the amplifier circuit in response to the detection signal from the address transition detecting circuit in reading operation. The second control circuit activates the input buffer circuit and further activates the amplifier circuit in writing operation.

The second control circuit first generates a first write control signal, and thereafter generates a second write control signal in writing operation. The first control circuit responds to the detection signal to generate an output control signal. The input buffer circuit is activated in response to the first write control signal. The amplifier circuit is activated in response to the second write control signal or the output control signal.

In reading operation, the amplifier circuit is activated in response to transition of an address signal, so that data read from a designated address of the memory circuit to the data bus is amplified and held by the amplifier circuit.

In writing operation, the input buffer circuit is activated, and the amplifier circuit is further activated, whereby external data is applied to the data bus. The data applied to the data bus is written in a designated address of the memory circuit. Simultaneously the data applied to the data bus is amplified and held by the amplifier circuit.

As described above, in writing operation, the written data applied to the data bus can be directly taken in the amplifier circuit without activating the address transition detecting circuit. Consequently, power consumption in writing operation can be reduced.

BRIEF DESCRIPTION OF THE DRAWINGS

FIG. 13 is a waveform diagram of signals showing the operation of the ATD generating circuit of FIG. 12.

FIG. 14 is a schematic diagram showing a detailed structure of the output control circuit included in the DRAMs of FIGS. 1 and 7.

DESCRIPTION OF THE PREFERRED EMBODIMENTS

Figure 1:
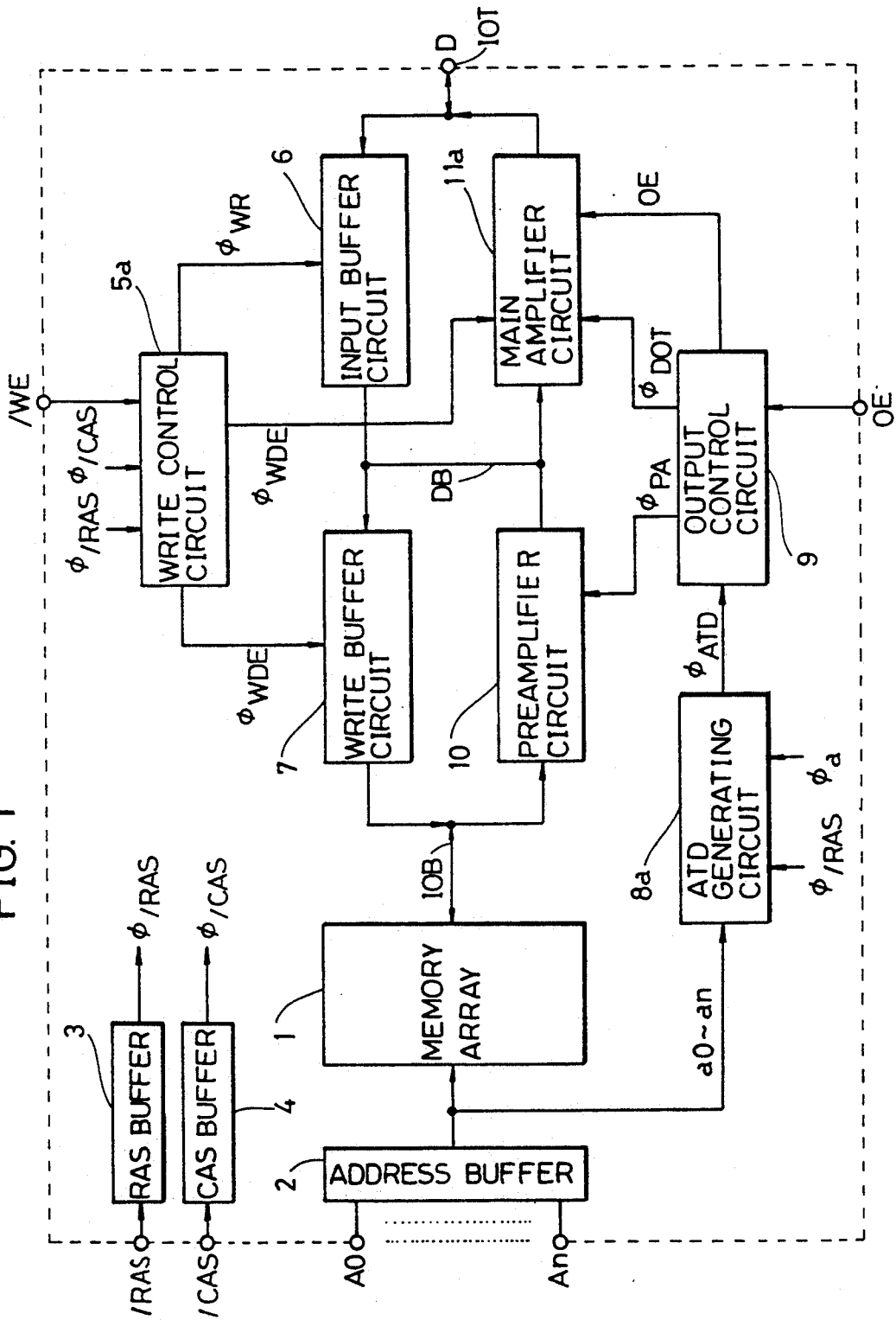
FIG. 1 is a block diagram showing a structure of a DRAM according to an embodiment of the present invention.

FIG. 1 is a block diagram showing a structure of a DRAM according to an embodiment of the present invention. The DRAM is different from a conventional DRAM shown in FIG. 7 in that a structure of a write control circuit 5a, and ATD generating circuit 8a, and a main amplifier circuit 11a thereof is different from that of the write control circuit 5, the ATD generating circuit 8, and the main amplifier circuit 11 shown in FIG. 7, and that the write control signal $\phi_{WT}$ is not applied from the write control circuit 5a to the ATD generating circuit 8a and the write control signal $\phi_{WDE}$ is applied from the write control circuit 5a to the main amplifier circuit 11a. The other part of the structure is the same as that shown in FIGS. 7, 10, 11, 14, and 15. This DRAM is formed on a chip.

The writing operation of the DRAM of FIG. 1 will now be described.

In a writing cycle, the write control circuit 5a first generates the write control signal $\phi_{WR}$. The input buffer circuit 6 is activated in response to the write control signal $\phi_{WR}$, whereby the data D externally applied to the input/output terminal IOT is amplified by the input buffer circuit 6, and the amplified data is applied to the data bus line DB.

The write control circuit 5a then generates the write control signal $\phi_{WDE}$. In response to the write control signal $\phi_{WDE}$, the write buffer circuit 7 and the main amplifier circuit 11a are activated, so that the data on the data bus line DB is amplified by the write buffer circuit 7, and the amplified data is applied to the input/output bus line IOB. The data on the input/output bus line IOB is written in an address designated by the internal address signals a0–an in the memory array 1. Simultaneously, the data on the data bus line DB is amplified and held by the main amplifier circuit 11a.

Figure 7:
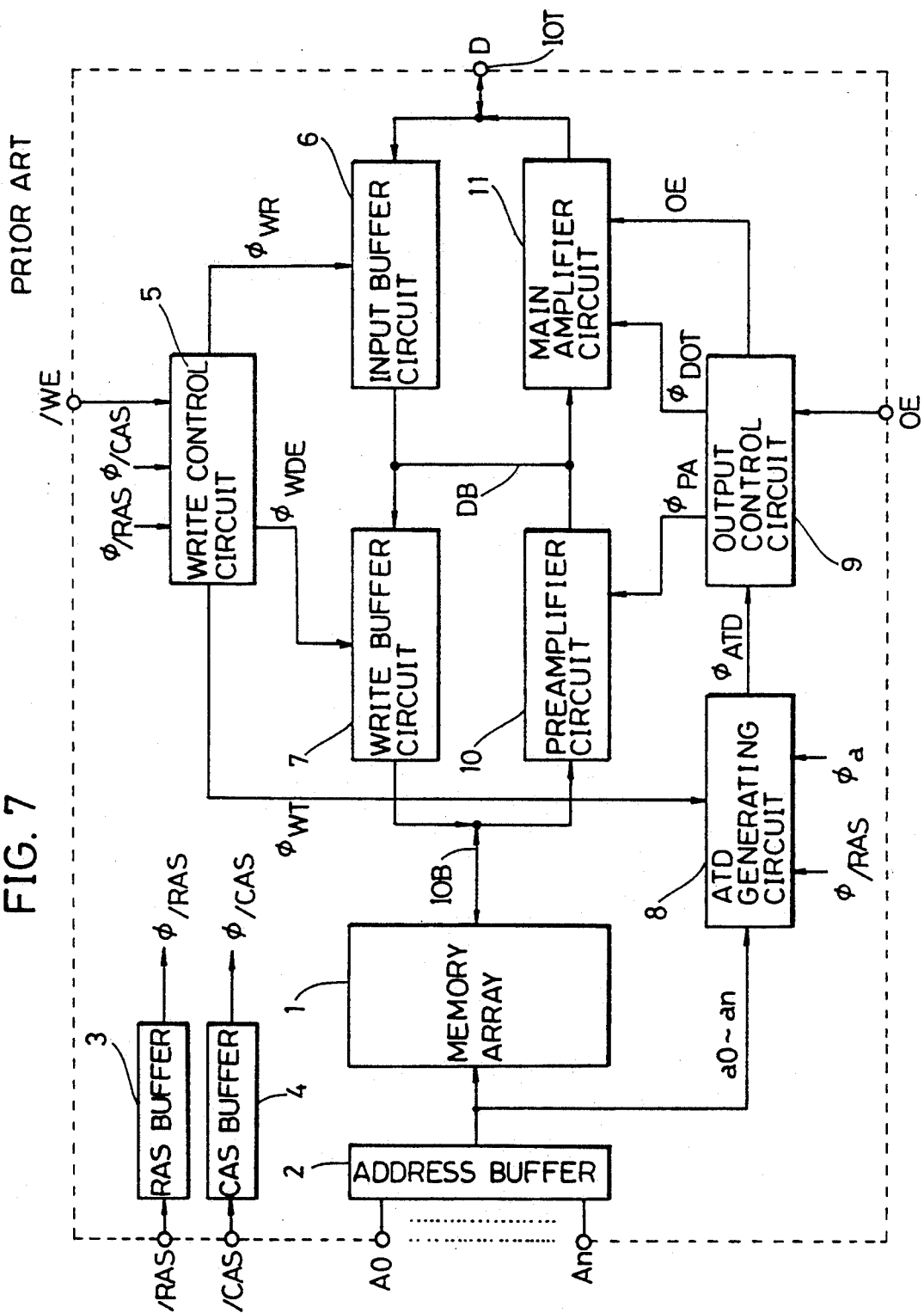
FIG. 7 is a block diagram showing a structure of a conventional DRAM.
Figure 8:
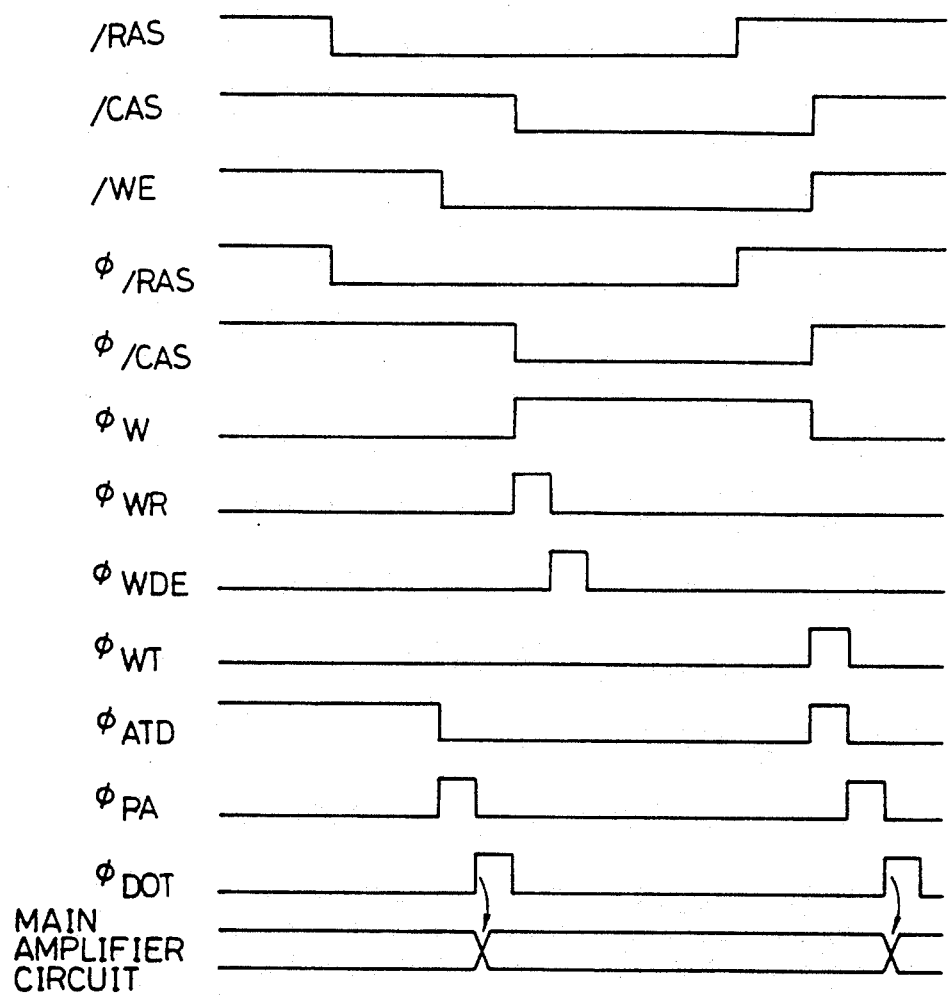
FIG. 8 is a waveform diagram of signals showing writing operation of the DRAM of FIG. 7.

The reading operation on the DRAM of FIG. 1 is the same as that of the DRAM of FIG. 7.

Figure 2:
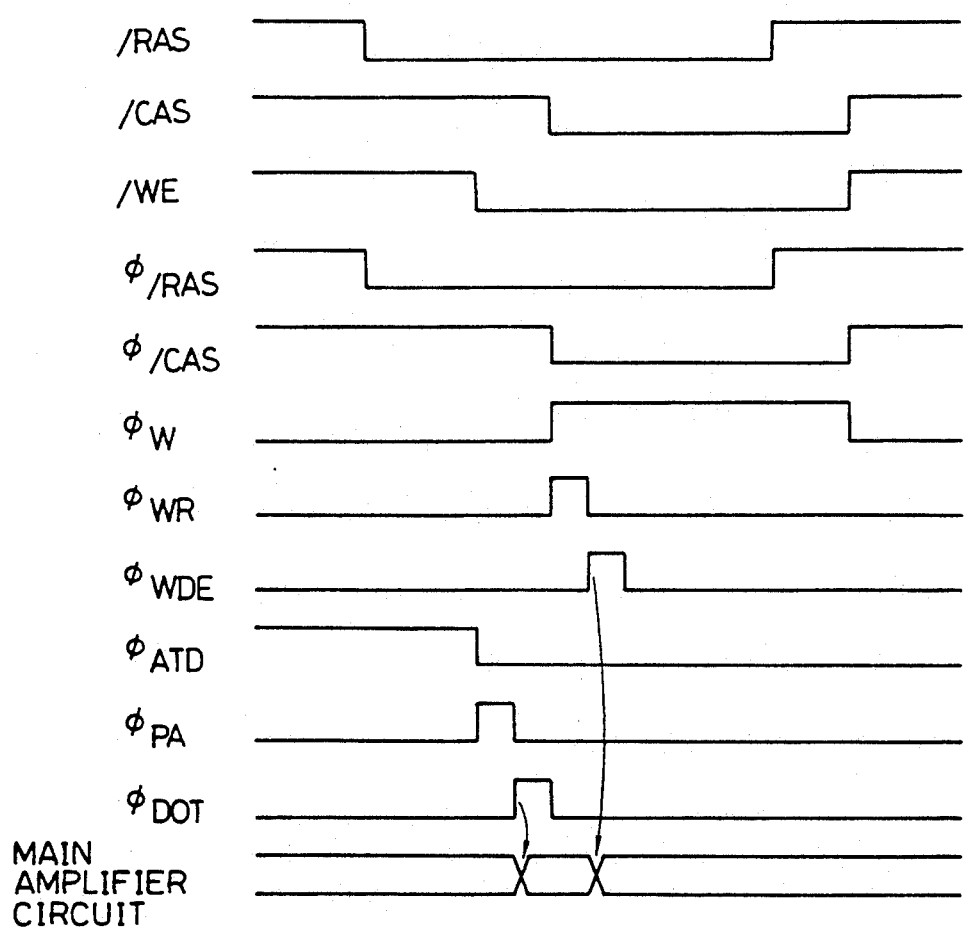
FIG. 2 is a waveform diagram of signals showing writing operation of the DRAM of FIG. 1.

FIG. 2 shows a waveform diagram of signals in writing operation of the DRAM of FIG. 1.

In a writing cycle, the write control signal $\phi_{WR}$ first rises, and thereafter the write control signal $\phi_{WDE}$ rises, whereby the data D externally applied to the input/output terminal IOT is written in the memory array 1 through the input buffer circuit 6 and the write buffer circuit 7. The written data on the data bus DB is simultaneously held in the main amplifier circuit 11a.

Figure 3:
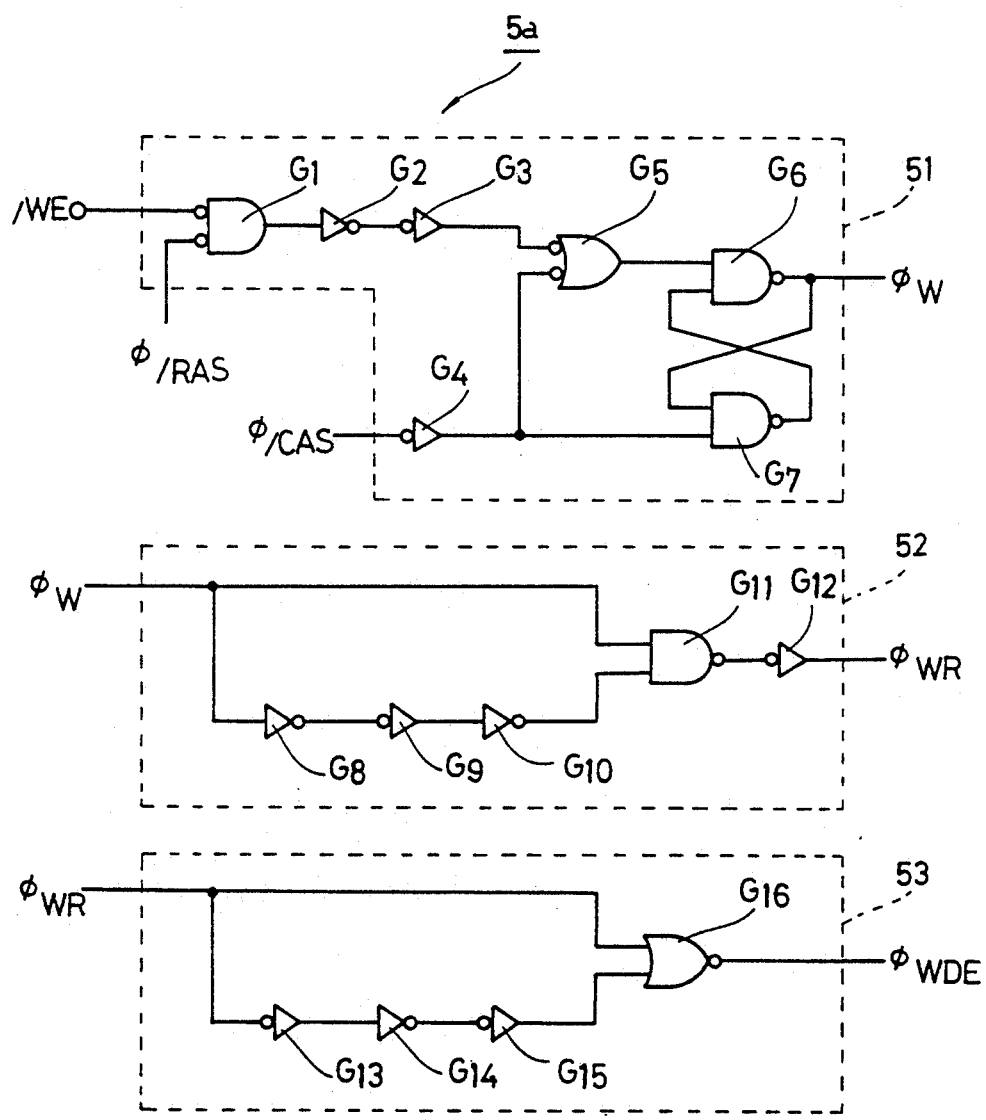
FIG. 3 is a schematic diagram showing a detailed structure of the write control circuit included in the DRAM of FIG. 1.
Figure 9:
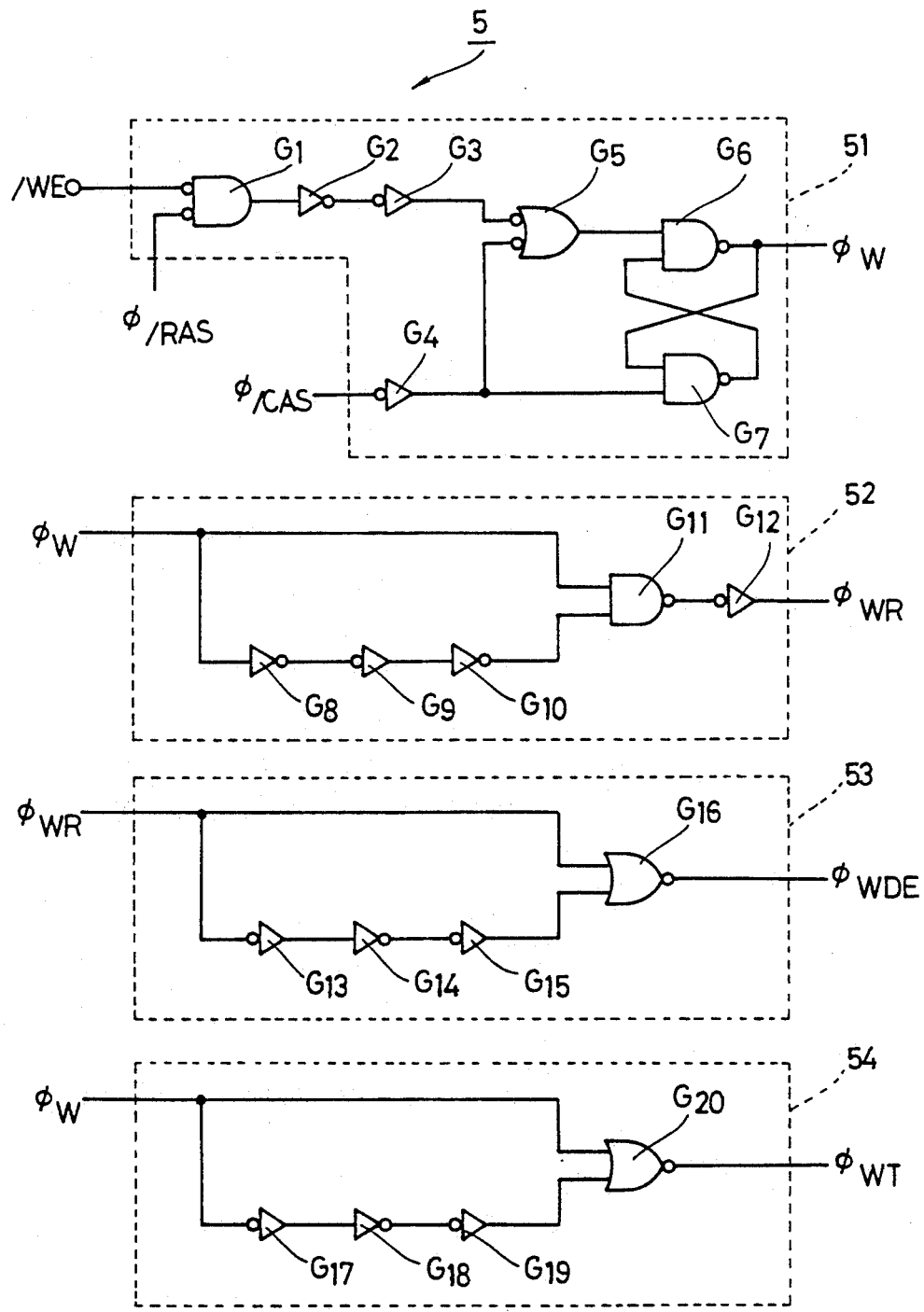
FIG. 9 is a schematic diagram showing a detailed structure of the write control circuit included in the DRAM of FIG. 7.
Figure 10:
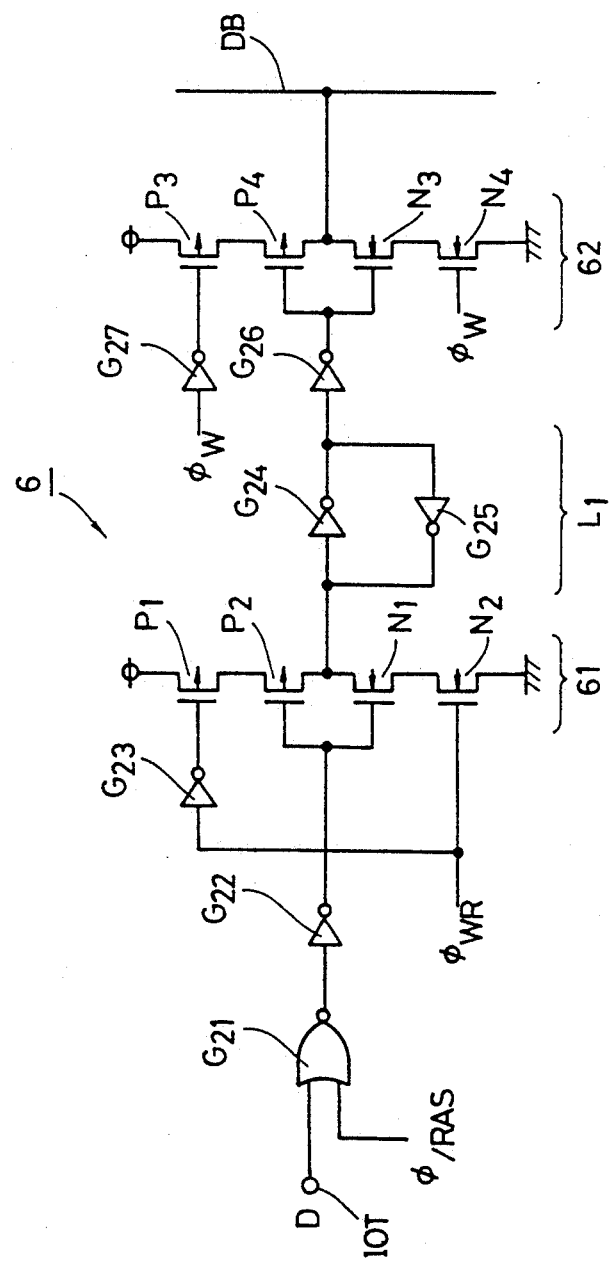
FIG. 10 is a schematic diagram showing a detailed structure of the input buffer circuit included in the DRAMs of FIGS. 1 and 7.
Figure 11:
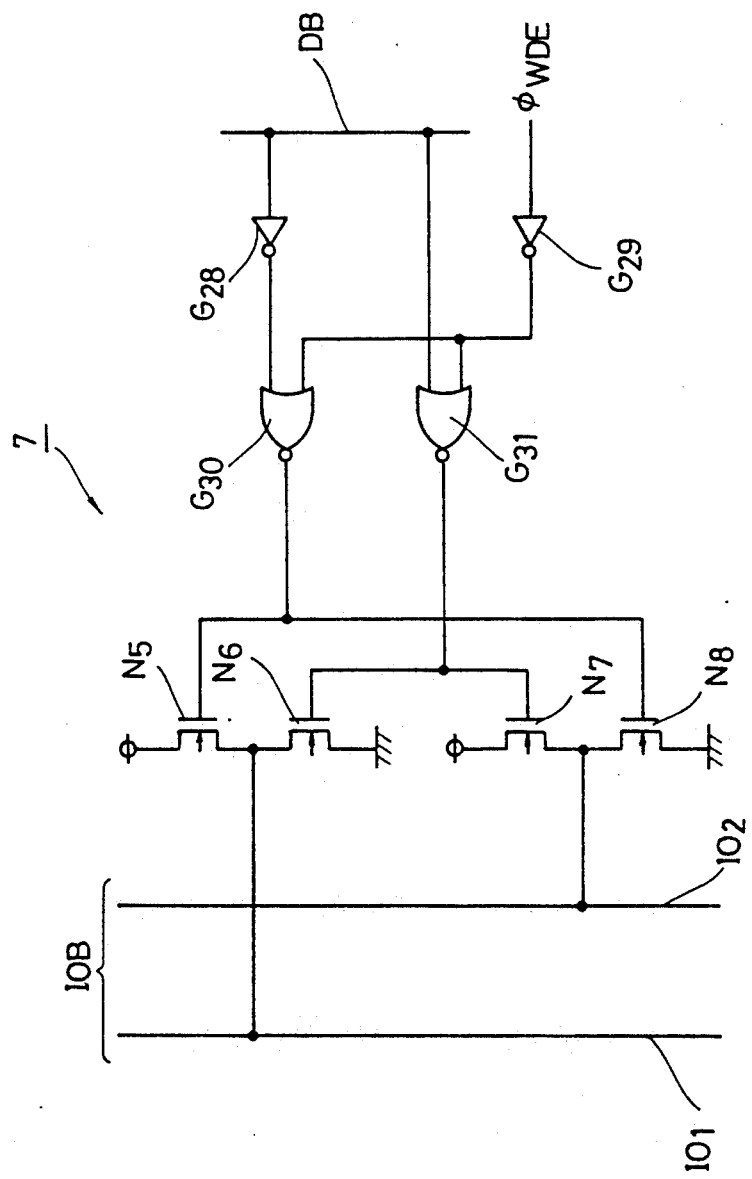
FIG. 11 is a schematic diagram showing a detailed structure of the write buffer circuit included in the DRAMs of FIGS. 1 and 7.

FIG. 3 is a schematic diagram showing a detailed structure of the write control circuit 5a. The write control circuit 5a includes signal generating circuits 51, 52, and 53. The structures of the signal generating circuits 51, 52, and 53 are the same as those of the signal generating circuits 51, 52, and 53 shown in FIG. 9, respectively. In the write control circuit 5a of FIG. 3, the signal generating circuit 54 shown in FIG. 9 is not provided.

As is seen from FIG. 2, when the internal column address strobe signal $\phi_{/CAS}$ falls to "L", with the external write enable signal /WE and the internal row address strobe signal $\phi_{/RAS}$ being in a state of "L", the control signal $\phi_W$ rises to "H" (writing state). Thereafter, when the internal column address strobe signal $\phi_{/CAS}$ rises to "H", the control signal $\phi_W$ falls to "L".

In response to the rise of the control signal $\phi_W$, the write control signal $\phi_{WR}$ rises to "H", and after a prescribed time period falls to "L". In response to the fall of the write control signal $\phi_{WR}$, the write control signal $\phi_{WDE}$ rises to "H", and after a prescribed time period falls to "L".

Figure 4:
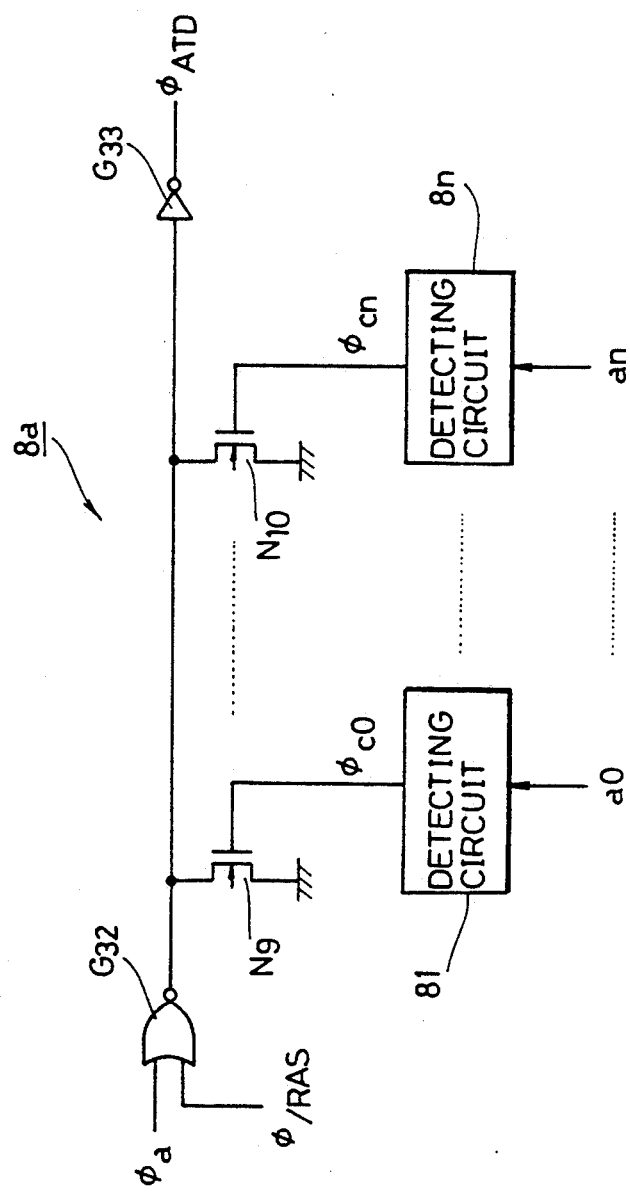
FIG. 4 is a schematic diagram showing a detailed structure of the ATD generating circuit included in the DRAM of FIG. 1.
Figure 12:
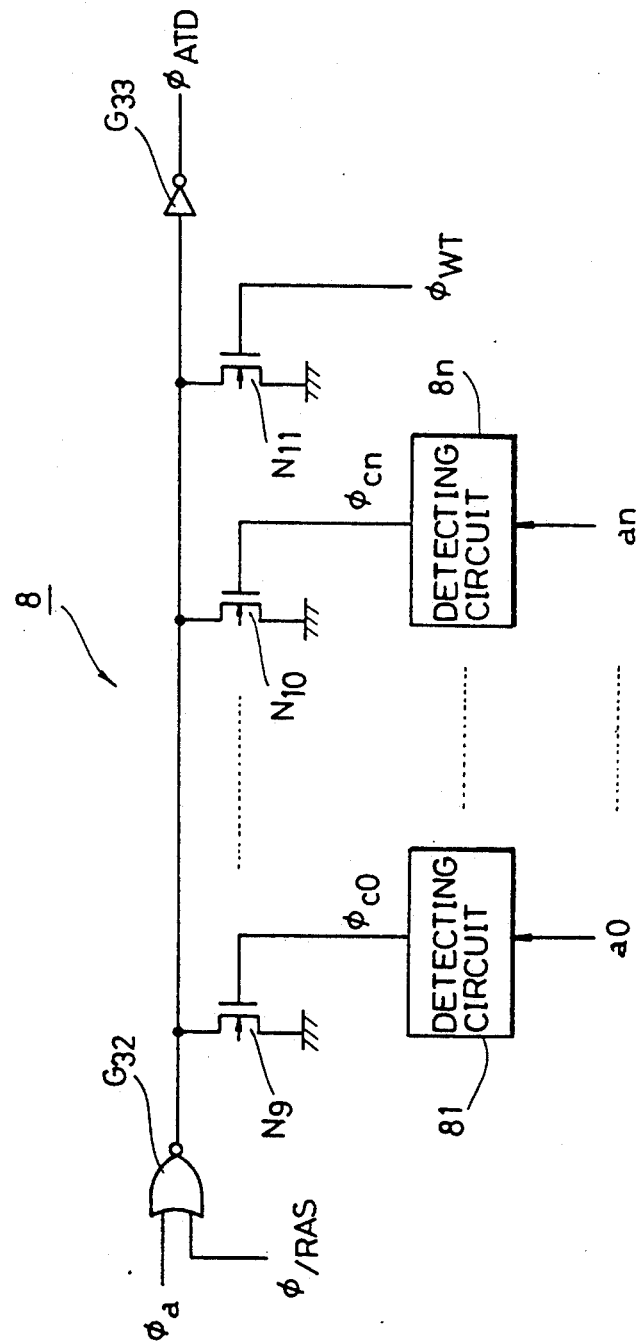
FIG. 12 is a schematic diagram showing a detailed structure of the ATD generating circuit included in the DRAM of FIG. 7.
Figure 15:
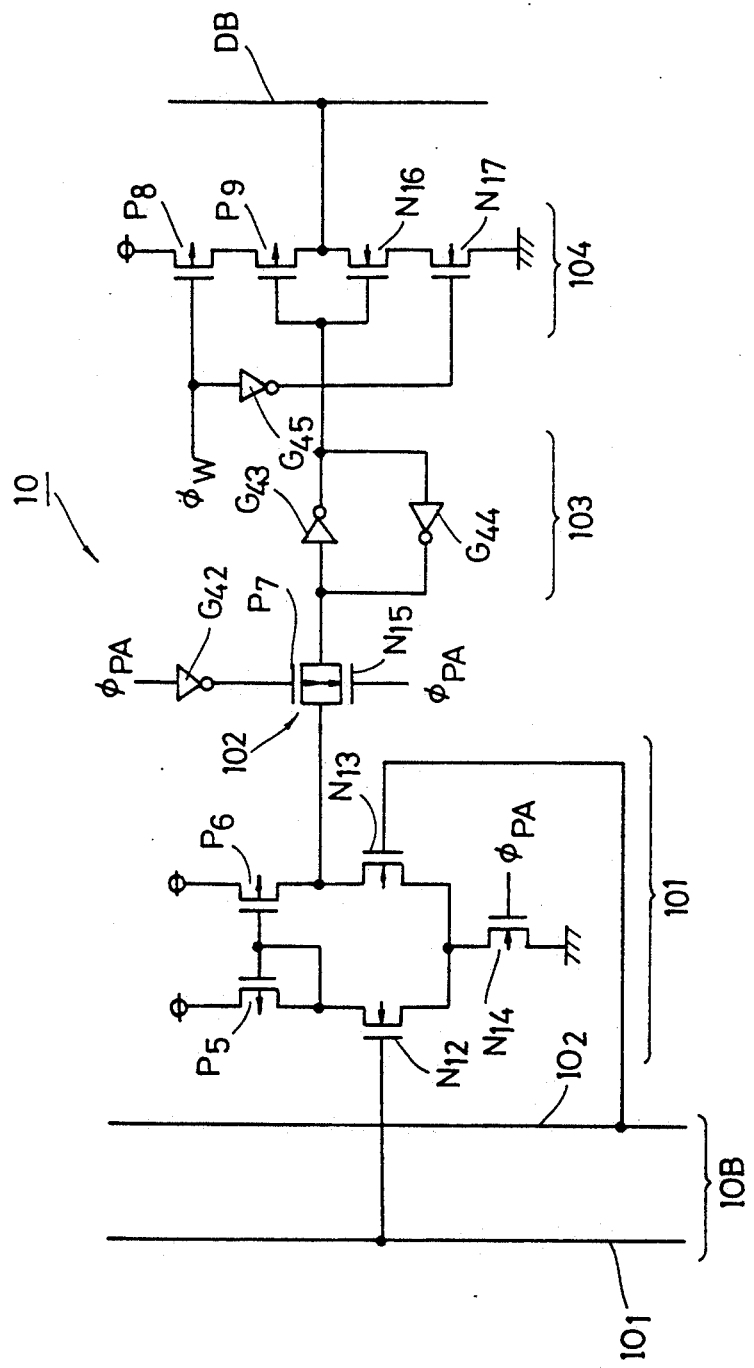
FIG. 15 is a schematic diagram showing a detailed structure of the preamplifier circuit included in the DRAMs of FIGS. 1 and 7.

FIG. 4 is a schematic diagram showing a detailed structure of the ATD generating circuit 8a. The ATD generating circuit 8a shown in FIG. 4 is different from the ATD generating circuit 8 shown in FIG. 12 in that the transistor N11 receiving the write control signal $\phi_{WT}$ is not provided. The other part of the structure is the same as that shown in FIG. 12.

Figure 5:
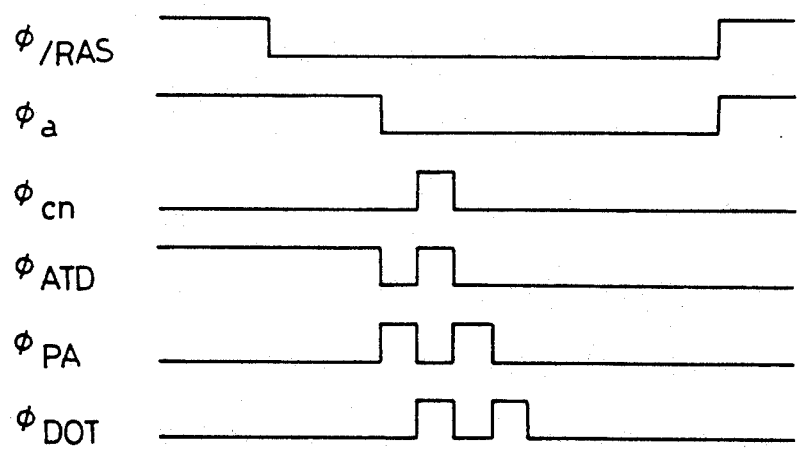
FIG. 5 is a waveform chart of signals describing the operation of the ATD generating circuit.

When the control signal $\phi_a$ and the internal row address strobe signal $\phi_{/RAS}$ are "L", an output signal of the NOR gate G32 attains "H". When any of the detecting circuits 81–8n generates the detection pulse $\phi_{ci}$ (i=0–n), either of the transistors N9-N10 is turned on, whereby, as is shown in FIG. 5, a pulse appears on the ATD signal $\phi_{ATD}$ provided from the inverter G33.

Figure 6:
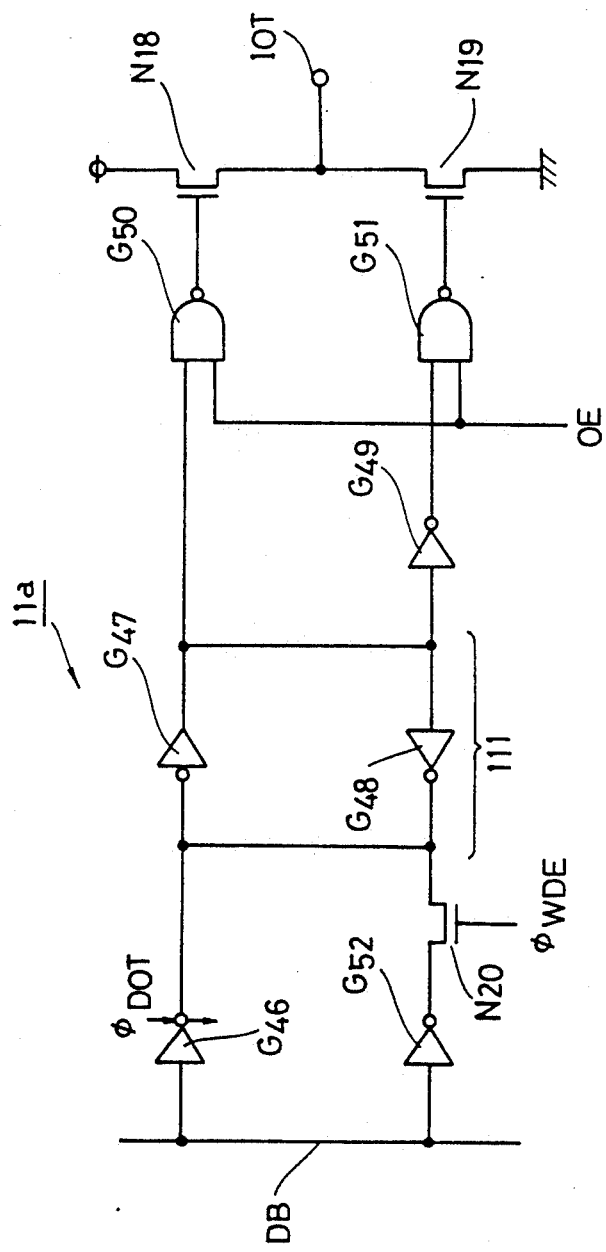
FIG. 6 is a schematic diagram showing a detailed structure of the main amplifier circuit included in the DRAM of FIG. 1.
Figure 16:
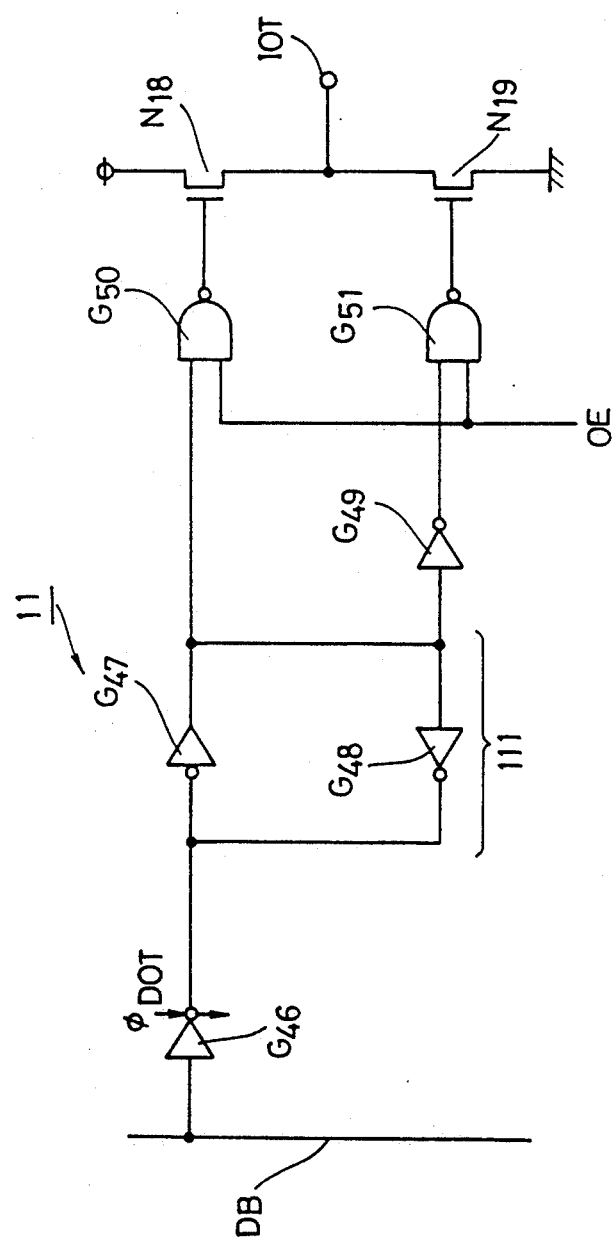
FIG. 16 is a schematic diagram showing a detailed structure of the main amplifier circuit included in the DRAM of FIG. 7.

FIG. 6 is a schematic diagram showing a detailed structure of the main amplifier circuit 11a. The main amplifier circuit 11a shown in FIG. 6 is different from the main amplifier circuit 11 shown in FIG. 16 in that an inverter G52 and an N channel MOS transistor for a transfer gate N20 are connected in series between the data bus line DB and the latch circuit 111. The gate of the transistor N20 is supplied with the write control signal $\phi_{WDE}$ from the write control circuit 5a (see FIGS. 1 and 3). The other part of the structure is the same as that shown in FIG. 16.

When the output control signal $\phi_{DOT}$ attains "H", the clocked inverter G46 is activated, so that the data on the data bus line DB is applied through the clocked inverter G46 to the latch circuit 111, and latched therein.

When the write control signal $\phi_{WDE}$ attains "H" in writing operation, the transistor N20 is turned on, whereby the data on the data bus line DB is applied through the inverter G52 and the transistor N20 to the latch circuit 111, and latched therein.

Instead of the write control signal $\phi_{WDE}$, another signal responsive to the write control signal $\phi_{WDE}$ may be applied to the gate of the transistor N20.

A clocked inverter may be provided instead of the inverter G52 and the transistor N20.

According to the above described embodiment, in writing operation, written data applied to the data bus line DB can be directly held in the main amplifier circuit 11a without activating the ATD generating circuit 8a and the preamplifier circuit 10. Therefore, power consumption in the writing operation can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   memory means for storing data;
   address signal input means for receiving an externally applied address signal;
   a data bus transmitting data to be written in an address of said memory means designated by said address signal, or data read from the address of said memory means designated by said address signal;
   input buffer means for receiving externally applied data and applying the data to said data bus;
   amplifier means for amplifying and holding the data applied to said data bus;
   address transition detecting means for detecting a transition of an address signal from said address signal input means to generate a detection signal;
   first control means responsive to said detection signal from said address transition detecting means for activating said amplifier means in reading operation; and
   second control means for supplying a first signal to said input buffer means along a first signal path for activating said input buffer means and for supplying a second signal to said amplifier means along a second signal path bypassing said address transition detection means.

2. The semiconductor memory device according to claim 1, wherein
   in writing operation, said second control means first generates a first write control signal, and thereafter a second write control signal,
   said first control means generates an output control signal in response to said detection signal, said input buffer means is activated in response to said first write control signal, and said amplifier means is activated in response to said second write control signal or said output control signal.

3. The semiconductor memory device according to claim 2, wherein said amplifier means comprises
holding means for amplifying and holding data, and
transmitting means responsive to said second write control signal or said output control signal for transmitting data from said data bus to said holding means.

4. The semiconductor memory device according to claim 3, wherein said transmitting means comprises a clocked inverter.

5. The semiconductor memory device according to claim 3, wherein said transmitting means comprises a transfer gate.

6. The semiconductor memory device according to claim 3, further comprising
output means responsive to an output enable signal externally applied for outputting data held in said holding means.

7. The semiconductor memory device according to claim 1, further comprising
an input/output bus transmitting data to be written in said memory means or data read from said memory means,
write buffer means for receiving data from said data bus and applying the data to said input/output bus, and
preamplifier means for amplifying data read onto said input/output bus, and applying the amplified data to said data bus, wherein
in reading operation, said first control means responds to said detection signal to first activate said preamplifier means, and thereafter activates said amplifier means,
in writing operation, said second control means first activates the input buffer means, and thereafter activates said write buffer means and said amplifier means.

8. The semiconductor memory device according to claim 7, wherein
in writing operation, said second control means first generates a first write control signal, and thereafter a second write control signal,
said first control means responds to said detection signal to first generate a first output control signal, and thereafter generates a second output control signal,
said input buffer means is activated in response to said first write control signal,
said write buffer means is activated in response to said second write control signal,
said preamplifier means is activated in response to said first output control signal, and
said amplifier means is activated in response to said second write control signal or said second output control signal.

9. The semiconductor memory device according to claim 1, wherein said memory means comprises a plurality of memory cells of a dynamic type.

10. The semiconductor memory device of claim 1, wherein said second signal path comprises a direct interconnection between said second control means and said amplifier means.

11. An operating method of a semiconductor memory device comprising memory means for storing data, input buffer means for receiving externally applied data and applying the data to a data bus, amplifier means for amplifying and holding the data applied to said data bus, address transition detecting means responsive to an address signal, and control means responsive to an eternal write control signal for generating internal write control signals,
comprising the steps of:
detecting transition of the address signal by said address transition detecting means to generate a detection signal;
activating said amplifier means in response to said detection signal in reading operation; and
activating each of said input buffer means and amplifier means in writing operation by supplying a first of said internal write control signals to said input buffer means along a first signal path and by supplying a second of said internal write control signals to said amplifier means along a second signal path bypassing said address transition detecting means.

* * * * *